United States Patent [19]
Minami et al.

[11] Patent Number: 5,093,703
[45] Date of Patent: Mar. 3, 1992

[54] THIN FILM TRANSISTOR WHITH 10-15% HYDROGEN CONTENT

[75] Inventors: Koji Minami, Osaka; Kaneo Watanabe, Kyoto; Masayuki Iwamoto, Hyogo, all of Japan

[73] Assignee: Sanyo Electric Co., Ltd., Osaka, Japan

[21] Appl. No.: 328,825

[22] Filed: Mar. 27, 1989

[30] Foreign Application Priority Data

Mar. 25, 1988 [JP] Japan .................. 63-72382

[51] Int. Cl.⁵ .............. H01L 27/01; H01L 27/13; H01L 29/78; H01L 45/00
[52] U.S. Cl. ...................... 357/23.7; 357/2; 357/4; 437/2; 437/24
[58] Field of Search ............ 437/24, 2; 357/23.7

[56] References Cited

U.S. PATENT DOCUMENTS 4,582,721 4/1986 Yoshino et al. ............. 437/2
4,693,759 9/1987 Noguchi et al. ............ 437/24

FOREIGN PATENT DOCUMENTS 59-117265  7/1984 Japan ................. 357/23.7
59-232462 12/1984 Japan ................. 357/23.7
60-164363  8/1985 Japan ................. 357/23.7
62-172692  7/1987 Japan ................. 357/23.7
63-110667  5/1988 Japan ................. 357/23.7

Primary Examiner—Andrew J. James
Assistant Examiner—Daniel Kim
Attorney, Agent, or Firm—Darby & Darby

[57] ABSTRACT

A thin film transistor includes a glass substrate on a surface of which a hydrogenated amorphous silicon (a-Si:H) film is formed. On the a-Si:H film, a source electrode and a drain electrode are respectively formed with a suitable interval between them. A gate electrode is formed positioned between the source electrode and the drain electrode. Insulation film is interposed between the gate electrode and the a-Si:H film. In a direct photo-CVD method using a low pressure mercury lamp, bandtail characteristics energy of the a-Si:H film is made less than 40 meV by controlling a decomposition region of a reaction gas, that is, the distance between the glass substrate and a gas supply port, whereby a thin film transistor having a good response is obtainable.

5 Claims, 3 Drawing Sheets

THIN FILM TRANSISTOR WHITH 10-15% HYDROGEN CONTENT

BACKGROUND OF THE INVENTION

1. Field of the invention

The present invention relates to a thin film transistor. More specifically, the present invention relates to a thin film transistor (hereinafter, "TFT") using an hydrogenated amorphous silicon (hereinafter "a-Si:H").

2. Description of the prior art

As is well known, a TFT can be used as a switching element of a pixel of a liquid crystal display. As TFT types, in accordance with positional relationships of an active layer (a semiconductor layer), a gate electrode, a source electrode and a drain electrode, there are a co-planar type, stagger type, and so on. However, a basic structure of such a TFT is as follows: a semiconductor layer is formed on a glass substrate, and a source electrode and a drain electrode are formed on the semiconductor layer, and a gate electrode is further formed on the semiconductor layer separated by an insulation film.

As the semiconductor layer of the TFT, a-Si:H film can be utilized. Such a-Si:H film is normally formed by a plasma CVD method using glow discharge, a direct photo-CVD method using a low pressure mercury lamp, or the like. In a conventional a-Si:H film obtained by such a method, optical bandgap Eopt was 1.7-1.9 eV, and hydrogen content was approximately 20%. In addition, bandtail characteristics energy of the conventional a-Si:H film was more than 50 meV.

If the bandtail characteristics energy is large as in the conventional a-Si:H film, there are many localized states, and therefore, in the TFT utilizing such a-Si H film, a value of average electron mobility $\mu$ by a field effect is small. Switching speed of the TFT is largely affected by the average electron mobility $\mu$. For example, the average electron mobility $\mu$ in the semiconductor layer of the conventional TFT was approximately 0.5 cm$^2$/V sec, and thus, the switching speed was not very rapid. In a case using such a TFT having slow switching speed, i.e. poor responsiveness as a switching element of a pixel of a liquid crystal display, no liquid crystal display with high performance is obtainable.

BRIEF SUMMARY OF THE INVENTION

Therefore, a principal object of the present invention is to provide a novel thin film transistor.

Another object of the present invention is to provide a thin film transistor using a-Si:H film having large average electron mobility Another object of the present invention is to provide a thin film transistor using a-Si:H film having bandtail characteristics energy less than 40 meV.

Another object of the present invention is to provide a method for manufacturing a-Si:H film in which bandtail characteristics energy is less than 40 meV.

In a thin film transistor in accordance with the present invention, a-Si:H film having bandtail characteristics energy less than 40 meV is utilized as an active layer (semiconductor layer)

Such a-Si:H film having a bandtail characteristics energy less than 40 meV can be formed by controlling the decomposition region of a reaction gas in accordance with the present invention in a direct photo-CVD method using a low pressure mercury lamp.

In accordance with the present invention, since a-Si:H film having a bandtail characteristics energy less than 40 meV is used as a semiconductor layer, average electron mobility in the semiconductor layer is large, and thus, the switching characteristic or cut-off frequency or responsiveness of the TFT can be increased. Therefore, if a TFT in accordance with the present invention is used as a switching element of a pixel of a liquid crystal display, since such a switching element is responsive to a signal having a high frequency, a high performance liquid crystal display is obtainable.

These objects and other objects, features, aspects and advantages of the present invention will become more apparent from the following detailed description of the embodiments of the present invention when taken in conjunction with accompanying drawings.

DESCRIPTION OF THE PREFERRED EMBODIMENTS

Figure 1:
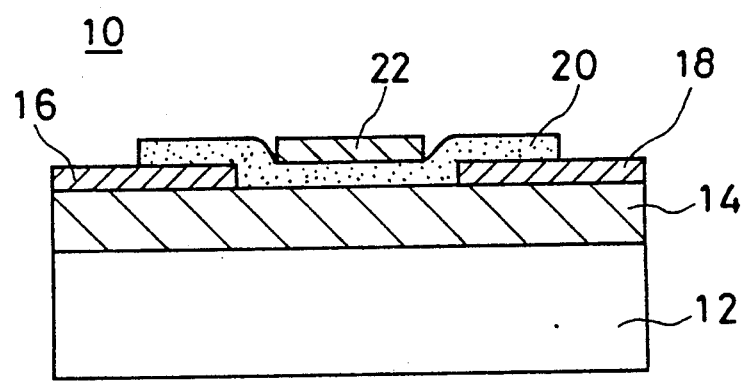
FIG. 1 is an illustrative sectional view showing a TFT of one embodiment in accordance with the present invention.

With reference to FIG. 1, a TFT 10 of this embodiment has a co-planar structure; however, it is pointed out in advance that the present invention is applicable to a TFT having an arbitrary structure such as a reverse co-planar type, a stagger type, a reverse stagger type or the like.

The TFT 10 includes a glass substrate 12 on which a-Si:H film 14 as an active layer (semiconductor layer) is formed. The a-Si:H film 14 is formed by a direct photo-CVD apparatus as described later in more detail. On the a-Si:H film 14, a source electrode 16 and a drain electrode 18 are formed to be spaced from each other with a suitable interval between them. The source electrode 16 and drain electrode 18 are formed in accordance with a predetermined pattern by vacuum evaporation of, for example, alminium. On the a-Si:H film 14, an insulation film 20 made of SiO$_2$, SiN$_x$, SiO$_x$N$_y$, and etc. is formed between the source electrode 16 and the drain electrode 18. The insulation film 20 is slightly superposed on the source electrode 16 and the drain electrode 18. On the insulation film 20, a gate electrode 22, made of, for example, chromium, gold, or the like, is formed, positioned between the source electrode 16 and the drain electrode 18

The detailed structure and operation of such a TFT 10 has been well known, and thus, a more detailed description will be omitted here.

Figure 2:
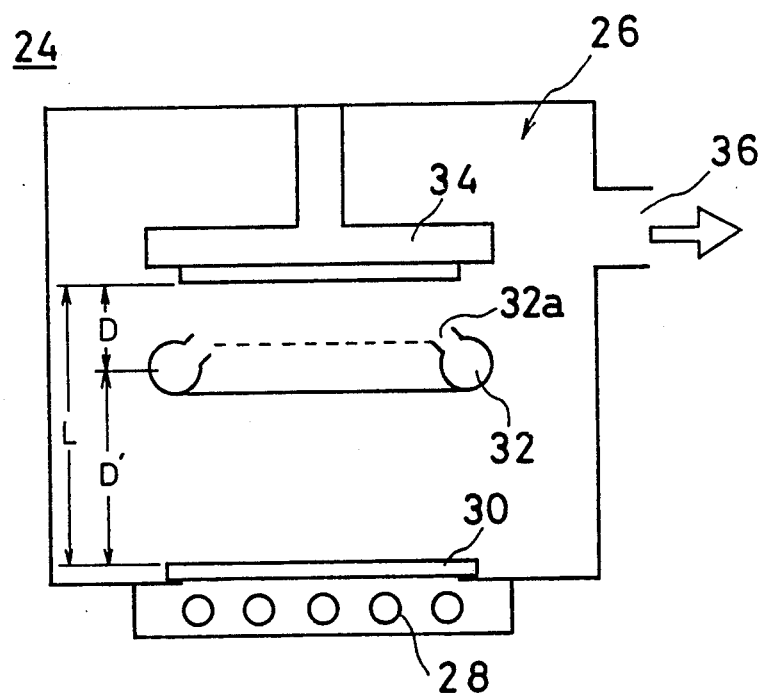
FIG. 2 is an illustrative view showing a direct photo-CVD apparatus of one embodiment in accordance with the present invention.

The above described a-Si:H film 14 is formed by a direct photo-CVD apparatus 24 as shown in FIG. 2 in the present invention. The CVD apparatus 24 includes a reaction chamber 26, and a low pressure mercury lamp 28 for making decomposition of a reaction gas, which is introduced in the reaction chamber 26, is formed below the reaction chamber 26. In addition, a quartz window 30 is provided above the low pressure mercury lamp 28, that is, at a bottom portion of the reaction chamber 26.

A gas supply tube 32 is provided within the reaction chamber 26, and the height position of a gas supply port 32a of the gas supply tube 32 is adjustable. Therefore, by adjusting the height position of the gas supply port 32a, distance D between the gas supply port 32a and the glass substrate 12 held on a receptor or holder 34 and/or distance D' between the gas supply port 32a and the quartz window 30 is adjusted. The holder 34 is also adjustable. Therefore, distance L between the glass substrate 12 and the low pressure mercury lamp 28 can also be changed. In addition, the holder 34 accommodates a heater (not shown) for heating the glass substrate 12.

An exhaust gas port 36 for discharging the reaction gas, which is supplied from the gas supply tube 32, and the gas after reaction, is formed on a side wall of the reaction chamber 26.

In such a CVD apparatus 24, $Si_2H_6$ as a reaction gas and $PH_3$ gas (5% with respect to $H_2$ gas) for obtaining N-channel a-Si:H film are supplied at flow rate of 5-20 SCCM and 0.1-1 SCCM, respectively. Then, a reaction pressure is set as 0.01-0.1 Torr and a temperature of the glass substrate 12 is set as 200°-300 °C. Furthermore, the distance L between the glass substrate 12 and the low pressure mercury lamp 28 is set as 5-30 cm.

In addition, in the conventional direct photo-CVD method, a reaction pressure is normally set as less than 0.2 Torr, but in this embodiment shown, as described above, the reaction pressure is made smaller than that of the conventional method Then, the distance D between the glass substrate 12 and the gas supply port 32a and the distance D' between the gas supply port 32a and the quartz window 30 are suitably set, respectively. In one embodiment, the height position of the gas supply port 32a of the gas supply tube 32 and the height position of the holder 34 are adjusted such that the ratio D/L becomes ½, that is D:D'=1:1. Then, the reaction gas is blown-out toward the glass substrate 12 from the gas supply port 32a.

In addition, luminous intensity of the light from the low pressure mercury lamp 28 at the position of the glass substrate 12 is set greater than 2 mW/cm² at a wave length of 185 nm and more than 8 mW/cm² at wave a length of 245 nm.

Figure 3:
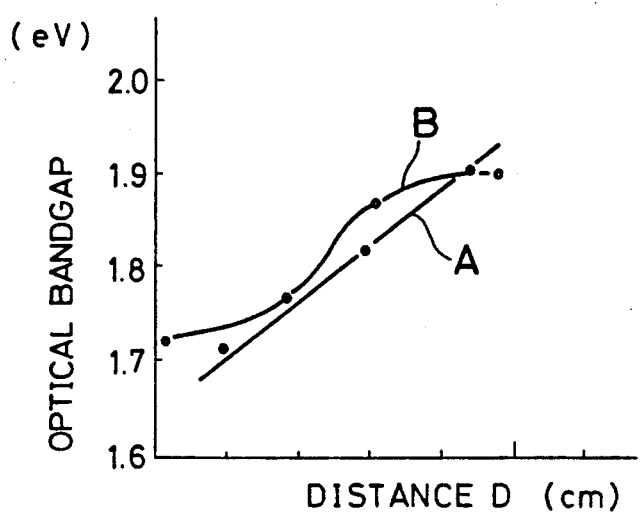
FIG. 3 is a graph showing relationship between distance D and D' and optical bandgap in the FIG. 2 apparatus.
Figure 4:
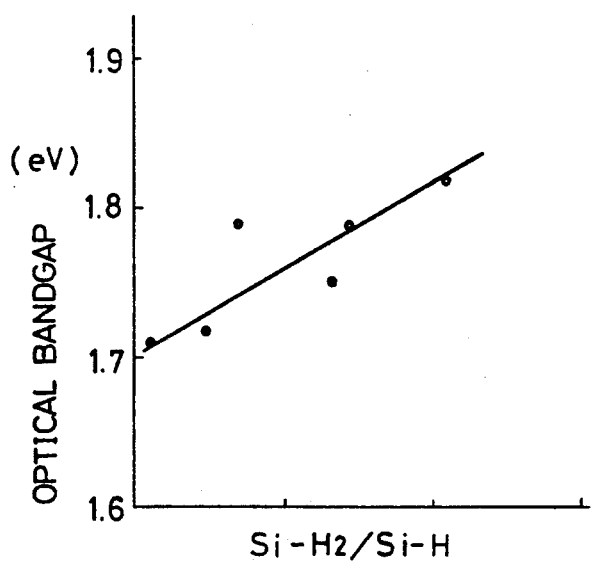
FIG. 4 is a graph showing relationship between optical bandgap and the ratio of Si-H$_2$/Si-H.

As seen from lines A and B in FIG. 3, by changing the distance D and D', it is possible to change optical bandgap of the a-Si:H film, which is formed on the glass substrate 12. This means that the optical bandgap becomes narrow as the distance D and D' are made smaller. Especially, the optical bandgap is largely affected by the distance D between the gas supply port 32a and the glass substrate 12 as shown by the line A. When the distance D is made smaller, since active substance generated by the decomposition of the reaction gas reaches the glass substrate 12 before the same is polymerized and reacted with the other active substance, it is possible to reduce bond amount of Si and $H_2$ in the a-Si:H film. In other words, by adjusting the distance D, it is possible to control the ratio of Si-$H_2$/Si-H in the a-Si:H film. The ratio Si-$H_2$/Si-H is correlative to the optical bandgap as seen from FIG. 4, and thus, by adjusting the distance D, the ratio Si-$H_2$/Si-H in the a-Si:H film is controlled.

In addition, through experimentation by the inventors, it was confirmed that by making the reaction pressure smaller than that in the past, it is possible to further reduce the ratio Si-$H_2$/Si-H in the a-Si:H film.

Figure 5:
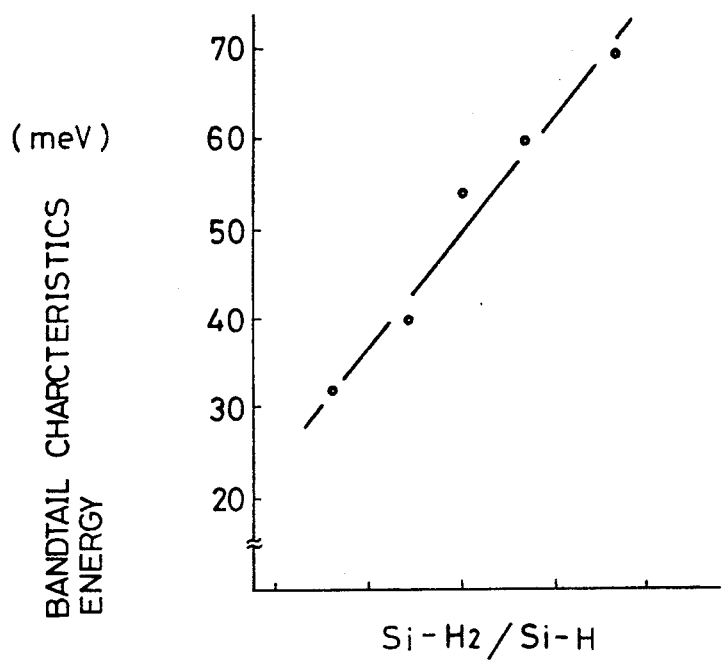
FIG. 5 is a graph showing relationship between Si-H$_2$/Si-H and bandtail characteristics energy.

Thus, since it is possible to change or control the ratio Si-$H_2$/Si-H within the a-Si:H film 14, as shown in FIG. 5, it is possible to control the bandtail characteristics energy of the a-Si:H film. This means that in the FIG. 2 apparatus, by adjusting the distance D (and D'), it is possible to control the bandtail characteristics energy of the a-Si:H film.

As a result, in accordance with the present invention, a a-Si:H film is produced in which the optical bandgap Eopt is 1.7–1.8 eV, the hydrogen content is 10–15%, and the bandtail characteristics energy is 30 meV (at the reaction pressure of 0.1 Torr)—40 meV (at the reaction pressure of 0.01 Torr).

By using such a-Si:H film having a small bandtail characteristics energy, thus obtained, as the active layer (semiconductor layer) 14 of the TFT 10, the characteristics of the TFT 10 can be improved.

More specifically, the average electron mobility $\mu$ within the a-Si:H film is given by the following equation (1).

$$\mu = \mu c \times nc/(nc + nt) \quad (1)$$

where, $\mu c$ is electron mobility in a conduction band, nc is excess electron density in the conduction band, and nt is excess electron density at localized states.

In the equation (1), since the localized states in the vicinity of the conduction band decrease when the bandtail characteristics energy of the a-Si:H film is small, the electron mobility $\mu c$ in the conduction band becomes large, and thus, it is predictable that the average electron mobility $\mu$ becomes large. In addition, a drain current $I_D$ of the TFT 10 is given by the following equation (2).

$$I_D = -\mu Q(W/L)V_D + (Wd/\rho L)V_D(Q<0) \quad (2)$$

where, Q is surface density of charges, W is channel width, L is channel length, $\rho$ is the resistance constant of the semiconductor layer, d is thickness of the semiconductor layer, and VD is the drain voltage.

Then, the ON-OFF characteristic $\gamma$ of the TFT 10 is given by the following equation (3).

$$\gamma = I_{on}/I_{off} = \mu C_{ox} V_G \rho/d \quad (3)$$

where, Cox is gate capacitance, and $V_G$ is a gate voltage.

As seen from the equation (3), the ON-OFF characteristic $\gamma$ increases as the average electron mobility $\mu$ becomes large. In addition, the switching speed also becomes rapid.

Figure 6:
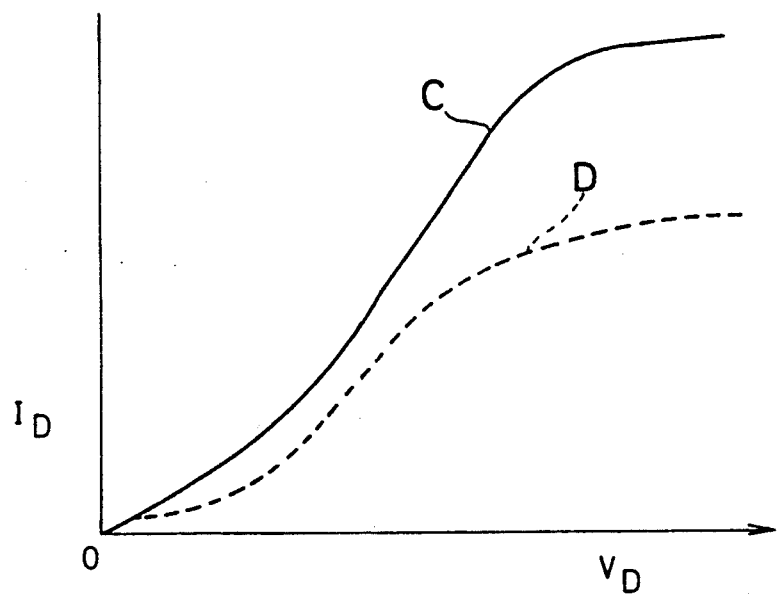
FIG. 6 is a graph showing $V_D$–$I_D$ characteristic of a TFT obtained in accordance with the present invention.

Therefore, in the TFT 10, obtained in accordance with the present invention, which includes the a-Si:h layer 14 having the bandtail characteristics energy of 32 meV, and the $V_D$–$I_D$ characteristic shown by a solid line C in FIG. 6, is obtained. In addition, in FIG. 6, the gate voltage $V_G$ is set as 10 V, that is, $V_G$=10 V. A dotted line D in FIG. 6 shows the $V_D$–$I_D$ characteristic of a TFT utilizing a a-Si:H film which is manufactured by the conventional plasma CVD method, which has the bandtail characteristics energy 50 meV.

As well illustrated in FIG. 6, in a saturated region, the drain current of the TFT 10 in accordance with the present invention becomes approximately 1.5 times the drain current of the conventional TFT. Therefore, it is understood that the average electron mobility $\mu$ in the semiconductor layer of the TFT 10 becomes larger.

Thus, if the average electron mobility $\mu$ becomes large, a cut-off frequency which is in proportion to the average electron mobility $\mu$ becomes large and switching time, which is in inverse proportion to the average electron mobility $\mu$ becomes small. Therefore, in accordance with the present invention, responsiveness of the TFT 10 can be drastically improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amorphous thin film transistor, comprising:
   a substrate;
   a hydrogenated amorphous silicon film formed on said substrate by chemical vapor deposition, said hydrogenated amorphous silicon film having about 10-15% hydrogen and bandtail characteristics energy not more than 40 meV;
   a source electrode and a drain electrode formed on said hydrogenated amorphous silicon film with a suitable interval between said electrodes;
   a gate electrode formed between the source electrode and the drain electrode; and
   insulation film interposed between said gate electrode and said hydrogenated amorphous silicon film.

2. An amorphous thin film transistor comprising a source electrode and drain electrode formed on a hydrogenated amorphous silicon film, a gate electrode formed on the hydrogenated amorphous silicon film, and an insulation film between said gate electrode and said source and drain electrodes, the bandtail characteristics energy of said hydrogenated amorphous silicon film being less than 40 meV, and the hydrogen content of said hydrogenated amorphous silicon is about 10-15%.

3. An amorphous thin film transistor as in claim 2, wherein said hydrogenated amorphous silicon film is formed on said substrate by chemical vapor deposition.

4. An amorphous thin film transistor as in claim 1, wherein said hydrogenated amorphous silicon film includes $SiH_2$ and $SiH$, the amount of $SiH_2$ being larger than the amount of $SiH$.

5. An amorphous thin film transistor as in claim 2, wherein said hydrogenated amorphous silicon film includes $SiH_2$ and $SiH$, the amount of $SiH_2$ being larger than the amount of $SiH$.

* * * * *